United States Patent
Kou et al.

(10) Patent No.: US 8,914,709 B1
(45) Date of Patent: *Dec. 16, 2014

(54) MANUFACTURING TESTING FOR LDPC CODES

(75) Inventors: Yu Kou, San Jose, CA (US); Lingqi Zeng, Turlock, CA (US); Jason Bellorado, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 398 days.

This patent is subject to a terminal disclaimer.

(21) Appl. No.: 13/041,218

(22) Filed: Mar. 4, 2011

Related U.S. Application Data

(60) Provisional application No. 61/339,514, filed on Mar. 4, 2010.

(51) Int. Cl.
*H03M 13/00* (2006.01)

(52) U.S. Cl.
USPC .......................................... 714/774; 714/704

(58) Field of Classification Search
USPC ................................................ 714/774, 704
See application file for complete search history.

(56) References Cited

U.S. PATENT DOCUMENTS

| | | | |
|---|---|---|---|
| 6,633,856 B2 | 10/2003 | Richardson et al. | |
| 6,895,547 B2 * | 5/2005 | Eleftheriou et al. | 714/801 |
| 8,286,048 B1 * | 10/2012 | Chen et al. | 714/752 |
| 2005/0283707 A1 * | 12/2005 | Sharon et al. | 714/758 |
| 2008/0276156 A1 | 11/2008 | Gunnam et al. | |
| 2008/0301521 A1 | 12/2008 | Gunnam et al. | |
| 2009/0106625 A1 * | 4/2009 | Jun et al. | 714/758 |
| 2010/0121585 A1 | 5/2010 | Wang et al. | |
| 2010/0185906 A1 * | 7/2010 | Rauschmayer et al. | 714/719 |
| 2011/0289286 A1 | 11/2011 | Feder et al. | |

* cited by examiner

*Primary Examiner* — M. Mujtaba K Chaudry
(74) *Attorney, Agent, or Firm* — Van Pelt, Yi & James LLP

(57) ABSTRACT

A storage system includes a channel detector, an LDPC decoder, and an erasure block. The channel detector is configured to receive data corresponding to data read from a storage and output an LLR signal. The LDPC decoder is configured to receive the LLR signal and output a feedback signal to the channel detector. The erasure block is configured to erase at a portion of at least one of the LLR signal and the feedback signal. A method for testing includes generating an error rate function corresponding to an erasure pattern. The function is a function of a number of LDPC iterations. The method includes determining testing parameters at least in part based on the error rate function, wherein the testing parameters comprise a testing number of LDPC iterations, a passing error rate, and the erasure pattern. The method includes testing storage devices using the testing parameters.

15 Claims, 7 Drawing Sheets

MANUFACTURING TESTING FOR LDPC CODES

CROSS REFERENCE TO OTHER APPLICATIONS

This application claims priority to U.S. Provisional Patent Application No. 61/339,514 entitled MANUFACTURING TESTING FOR LDPC CODES filed Mar. 4, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives. It would be desirable to develop testing techniques for LDPC storage applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
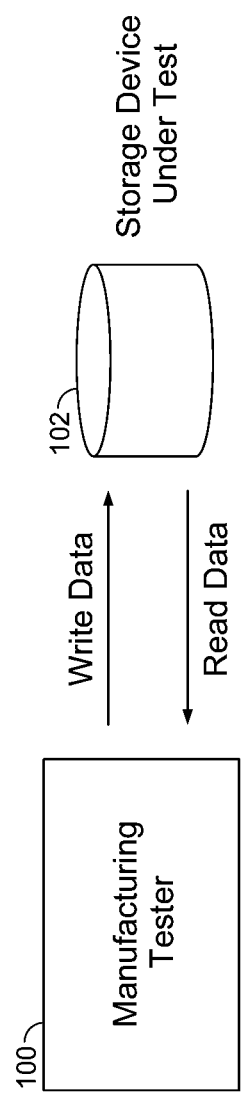
FIG. 1 is a block diagram illustrating an embodiment of a manufacturing test system.

FIG. 1 is a block diagram illustrating an embodiment of a manufacturing test system. Manufacturing tester 100 is configured to test a storage device 102 by writing data to storage device 102, reading the data back from storage device 102, and determining whether storage device 102 meets a certain level of quality such that storage device 102 may be shipped as a product and/or integrated into a larger system. In various embodiments, storage device 102 comprises various types of media. Some examples of storage media include a hard disk drive (HDD) and a flash drive.

Storage device 102 may have different types of defects. For example, storage device 102 may have "stuck-at" faults. Other types of defects include amplitude dropout defects and permanently polarized media defects. For amplitude dropout defects, some portions of storage device 102 have reduced amplitudes. For permanently polarized media defects, some portions of storage device 102 always read back the same value (i.e., they are "permanently" polarized to a value).

Defects of storage device 102 can grow in size and severity after storage device 102 is deployed in the field. Therefore, even if storage device 102 is deemed to have an acceptable level of quality during manufacturing testing, the performance of storage device 102 may degrade to an unacceptable level of quality over time. To ensure that storage device 102 maintains an acceptable level of quality over its lifetime, storage device 102 must meet the deemed acceptable level of quality with a degree of margin during manufacturing testing.

In some embodiments, manufacturing tester 100 writes known data to storage device 102, reads the data back from storage device 102, compares the known data with the data read back from storage device 102, and then determines an error rate for storage device 102. If the error rate is lower than a passing error rate, then storage device 102 passes the test. Otherwise, storage device 102 fails the test and cannot be shipped as a product and/or integrated into a large system.

In various embodiments, manufacturing tester 100 is configured in a variety of ways. In some embodiments, manufacturing tester 100 includes components specifically configured and/or built only to perform a particular task, such as an application-specific integrated circuit (ASIC). In some embodiments, manufacturing tester 100 includes general purpose components temporarily configured to perform a specific task, such as a field programmable gate array (FPGA). In some embodiments, manufacturing tester 100 includes a processor and a memory coupled with the processor, where the memory is configured to provide the processor with instructions which, when executed, cause the processor to perform certain steps.

In some embodiments, the data written from manufacturing tester 100 to storage device 102 is encoded using a low-density parity-check (LDPC) code. The LDPC encoded data may be decoded with one or more LDPC iterations.

Figure 2:
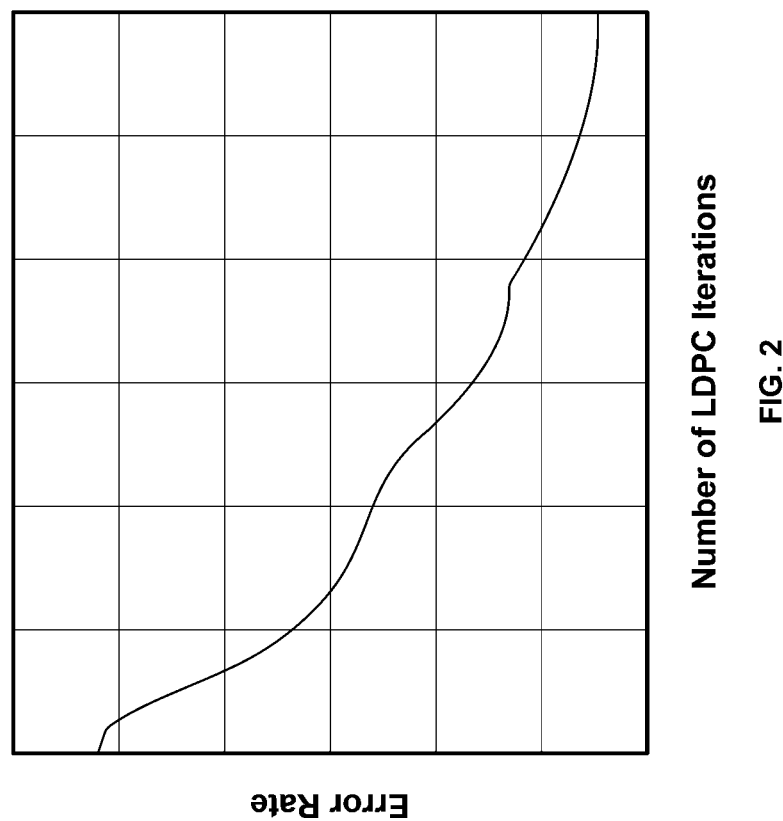
FIG. 2 is a diagram illustrating an exemplary plot of the number of LDPC iterations versus error rate.

FIG. 2 is a diagram illustrating an exemplary plot of the number of LDPC iterations versus error rate. Such a plot is also referred to as an error rate function. The error rate shown in FIG. 2 is an average error rate, e.g., an average error rate for a plurality of storage devices when decoding is performed at a given number of LDPC iterations. In some embodiments, an error rate function is generated empirically, that is, through experimentation. In some embodiments, an error rate function is obtained through some other means, for example using modeling.

As shown in FIG. 2, as the number of LDPC iterations increases, the correction power of LDPC increases, and the error rate of LDPC tends to decrease. In some embodiments, the error rate may be specified as a sector failure rate (SFR). Typically, storage device 102 comprises a plurality of sectors. Each sector is a subdivision of a track on storage device 102 and stores a fixed amount of user data. The SFR is the probability that the errors of a sector are no longer correctable by LDPC. In some other embodiments, error rate units other than SFR may be used.

Typically, the number of LDPC iterations used for testing storage device 102 ($N_{testing}$) is smaller than the number of LDPC iterations used during the normal operation of storage device 102 ($N_{normal}$). $N_{normal}$ (and the correction power) should be large enough such that the corresponding error rate (e.g., $SFR_{normal}$) is sufficiently low; otherwise, storage device 102 will likely be returned by the end user as defective. However, if $N_{testing}$ is selected to be the same as $N_{normal}$, then the expected error rate during testing (e.g., $SFR_{testing}$) will be very low (i.e., as low as $SFR_{normal}$), and the length of the test time for testing each sector of storage device 102 will become prohibitively long. This is because when the $SFR_{testing}$ is very low, e.g., $10^{-6}$ or lower, a huge amount of data has to be written to a sector and then read back from the sector before a sector failure may be observed even once. Therefore, $N_{testing}$ is typically selected to be smaller than $N_{normal}$ in order to reduce the per sector testing time.

Another reason for selecting $N_{testing}$ to be smaller than $N_{normal}$ is due to field-grown defects. During testing, if storage device 102 can pass the test despite a reduced correction power corresponding to $N_{testing}$, then the extra correction power reserved for the normal operation of storage device 102 can be used to handle the field-grown defects. Therefore, $N_{testing}$ is a testing parameter that is determined prior to the testing of storage device 102.

Another testing parameter that is determined prior to the testing of storage device 102 is a passing error rate corresponding to $N_{testing}$. As discussed above, if the error rate of storage device 102 during manufacturing testing is lower than the passing error rate, then storage device 102 passes the test. Otherwise, storage device 102 fails the test and cannot be shipped as a product and/or integrated into a large system.

Figure 3:
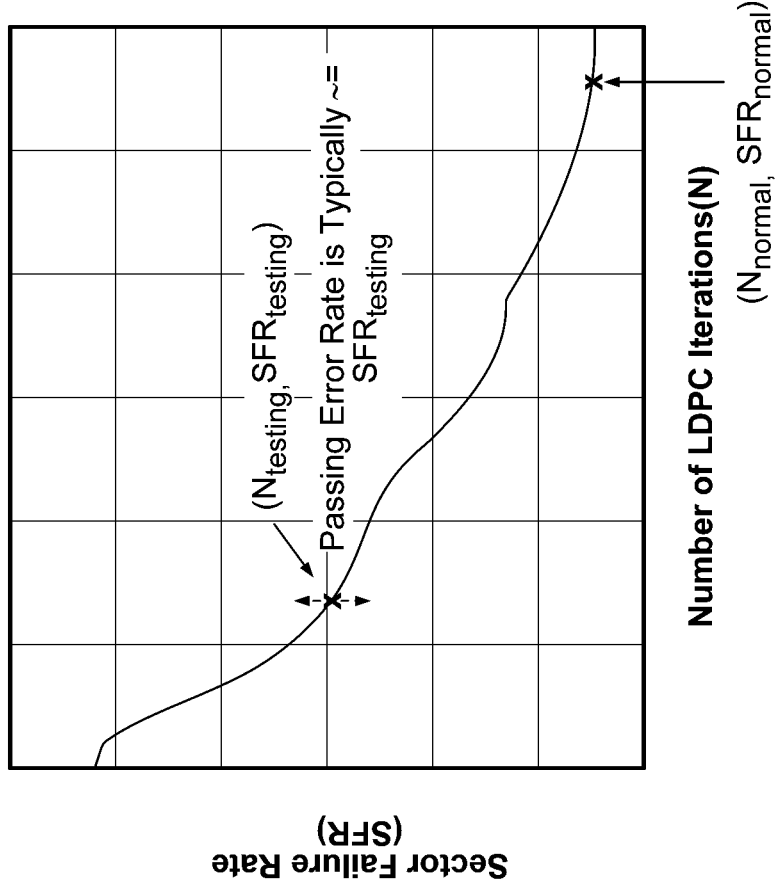
FIG. 3 is a diagram illustrating an exemplary number of LDPC iterations used for testing ($N_{testing}$) and an exemplary number of LDPC iterations used during the normal operation of storage device 102 ($N_{normal}$) being plotted on an error rate function.

FIG. 3 is a diagram illustrating an exemplary number of LDPC iterations used for testing ($N_{testing}$) and an exemplary number of LDPC iterations used during the normal operation of storage device 102 ($N_{normal}$) being plotted on an error rate function. $SFR_{testing}$ may be used to determine the passing error rate corresponding to $N_{testing}$. In some embodiments, the passing error rate may be set to $SFR_{testing}$. In some embodiments, the passing error rate is determined based on $SFR_{testing}$, but is set to a value lower than $SFR_{testing}$ in order to provide sufficient margin for defects that grow over time in the field.

Figure 4:
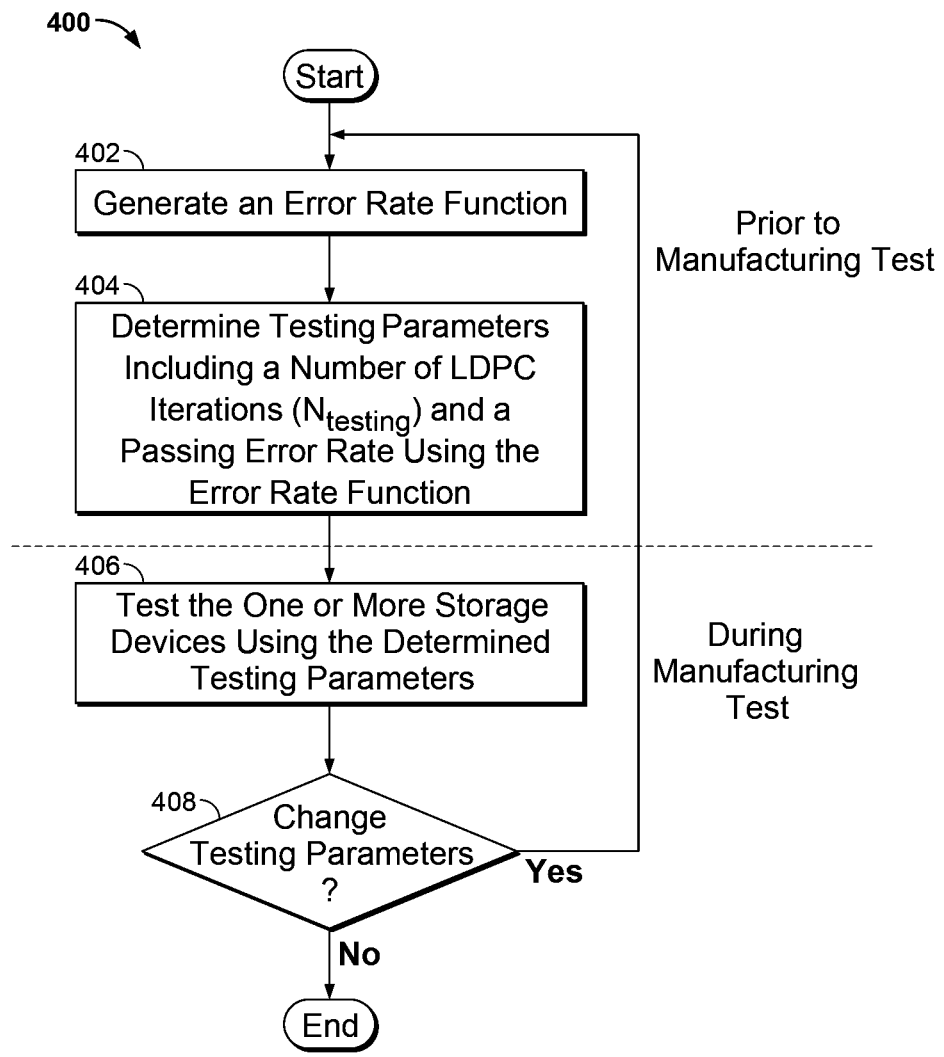
FIG. 4 is a flowchart illustrating an embodiment of a process 400 for developing a manufacturing test and testing one or more storage devices using the developed test.

FIG. 4 is a flowchart illustrating an embodiment of a process 400 for developing a manufacturing test and testing one or more storage devices using the developed test. In the example shown, the flowchart is divided into two portions: prior to a manufacturing test (steps 402-404) and during a manufacturing test (steps 406-408).

At 402, an error rate function that is a function of the number of LDPC iterations is generated. For example, a plurality of storage devices may be used to generate the error rate function. For each storage device, known data is encoded using an LDPC code and written to the storage device. The data is then read back and decoded at different numbers of iterations. The decoded data is then compared with the known data to determine whether there is any error. The errors are recorded and then used to generate the error rate function.

At 404, a set of testing parameters, including $N_{testing}$ and its corresponding passing error rate, is determined using the generated error rate function. As described above, the set of testing parameters can be determined based on a number of factors, including the total amount of time that can be allocated for testing, the amount of test time allocated per storage device, and the number of sectors to be tested per storage device. Other factors include a target manufacturing yield, a target manufacturing failure parts per million (FPPM) value, and a target margin reserved for field-grown defects.

At 406, one or more storage devices are tested using the determined testing parameters, including $N_{testing}$ and its corresponding passing error rate. For example, after $N_{testing}$ iterations, if the error rate of a storage device is higher than the passing error rate, then the storage device being tested is marked as having failed the manufacturing test.

At 408, a determination is made as to whether the testing parameters should be changed. If the testing parameters have been changed, then the process returns to 402 (or 404), and process 400 is repeated again.

Figure 5:
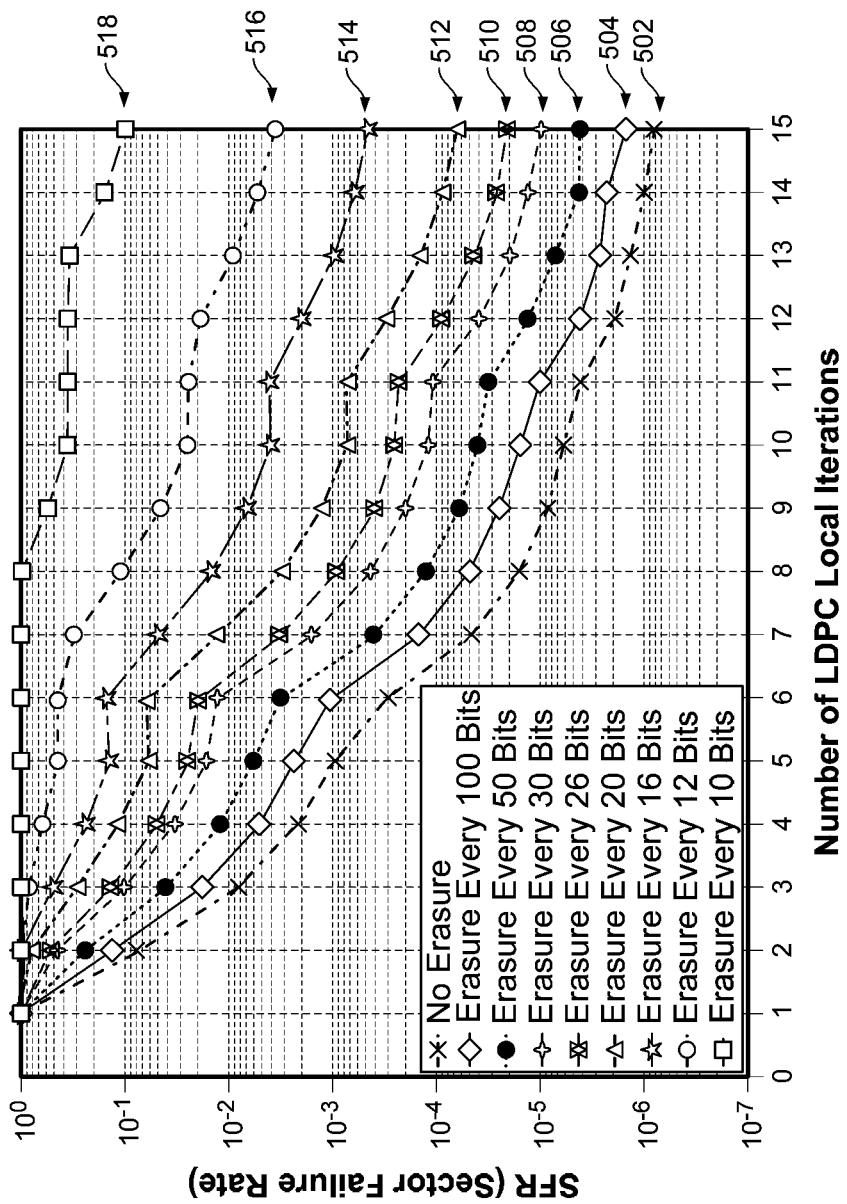
FIG. 5 is a diagram illustrating a plurality of error rate functions for determining the testing parameters for testing storage devices.

FIG. 5 is a diagram illustrating a plurality of error rate functions for determining the testing parameters for testing storage devices. LDPC is a powerful error correcting code. As a result, as the number of LDPC iterations increases, the corresponding SFR drops sharply as shown in error rate function 502. For example, when the number of LDPC iterations is six, the SFR is between $10^{-3}$ and $10^{-4}$. When the number of LDPC iterations is increased to seven, the SFR quickly drops to a value between $10^{-4}$ and $10^{-5}$. However, having such a sharp error rate function poses an issue: if the passing error rate is desired to be set at around $10^{-4}$ (e.g., based on the amount of time that is allocated for testing), setting the number of LDPC iterations to seven may result in passing too many storage devices (i.e., having a high manufacturing yield, but being overly optimistic) and many of these storage devices may not be able to maintain an acceptable level of quality over their respective lifetime, while setting the number of iterations to six may result in passing too few storage devices (i.e., having a low manufacturing yield, but being overly pessimistic) and many of the failed storage devices might have been able to maintain an acceptable level of quality over their respective lifetime. In other words, the error rate function 502 does not have a high enough resolution to provide many combinations of the number of LDPC iterations and SFRs from which to determine the testing parameters. Therefore, a method that can increase the number of combinations of the number of LDPC iterations and SFRs from which to select the testing parameters is desirable.

Figure 6:
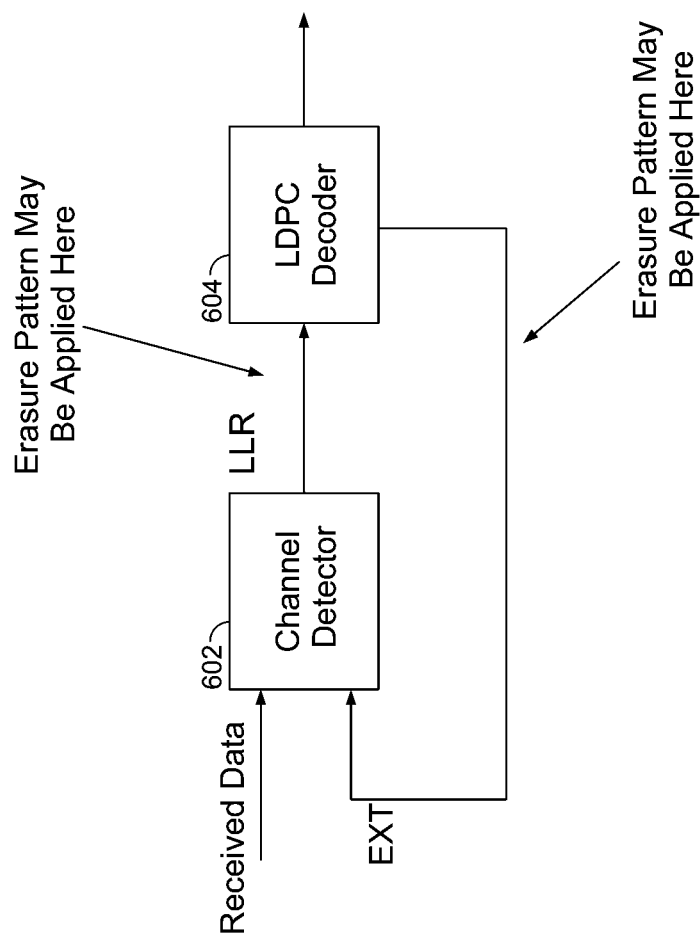
FIG. 6 is a diagram illustrating a simplified block diagram of an LDPC decoder as modified for testing.

FIG. 6 is a diagram illustrating a simplified block diagram of an LDPC decoder as modified for testing. As shown in FIG. 6, the received data is fed as an input into a channel detector 602. In some embodiments, channel detector 602 is a soft decision decoder. For example, channel detector 602 may be implemented using a soft output Viterbi algorithm (SOYA). In another example, channel detector 602 is implemented using a Max-Log-MAP algorithm. Channel detector 602 outputs a log-likelihood ratio (LLR), which is defined by the following equation:

$$L(c_i) = \log\left(\frac{Pr(c_i = 0 | \text{channel output for the sector})}{Pr(c_i = 1 | \text{channel output for the sector})}\right)$$

where $c_i$ is the $i^{th}$ bit of the transmitted codeword, $c_j$. The LLR is fed as an input to an LDPC decoder 604. In various embodiments, LDPC decoder 604 may be implemented using various algorithms, including the sum-product algorithm, min-sum algorithm, and belief propagation algorithm. LDPC decoder 604 sends a feedback signal back to channel detector 602. This feedback signal carries extrinsic information (EXT) from LDPC decoder 604 to channel detector 602. Extrinsic information includes additional estimates of probabilities produced by LDPC decoder 604 based on the LLR.

As shown in FIG. 6, erasure patterns are applied to the LLR values going from channel detector 602 to LDPC decoder 604 and/or the feedback signal carrying the extrinsic information from LDPC decoder 604 to channel detector 602. In some embodiments, erasing the LLR/EXT values includes reducing the amplitude or zeroing out the LLR/EXT values. In some embodiments, the erasure patterns are evenly distributed. For example, for every x number of LLR/EXT values, one of the LLR/EXTs may be erased. However, erasure patterns other than evenly distributed erasure patterns may be used as well.

Applying erasure patterns to the LLR/EXT values weakens the LDPC's correction capability. The error rate functions generated with different erasure patterns are illustrated in FIG. 5. For example, error rate function 502 is generated with no erasure. Error rate function 504 is generated by erasing one LLR value out of every one hundred LLR values. This erasure pattern is referred to as $\text{Erasure}_{100}$. Error rate function 506 is generated by erasing one LLR value out of every fifty LLR values. This erasure pattern is referred to as $\text{Erasure}_{50}$. As the LLR/EXT values are erased more frequently, the error rate functions become less and less steep. These error rate functions provide more combinations of the number of LDPC iterations and SFRs from which to select the testing parameters, including $N_{testing}$, passing error rate, and erasure pattern.

Figure 7:
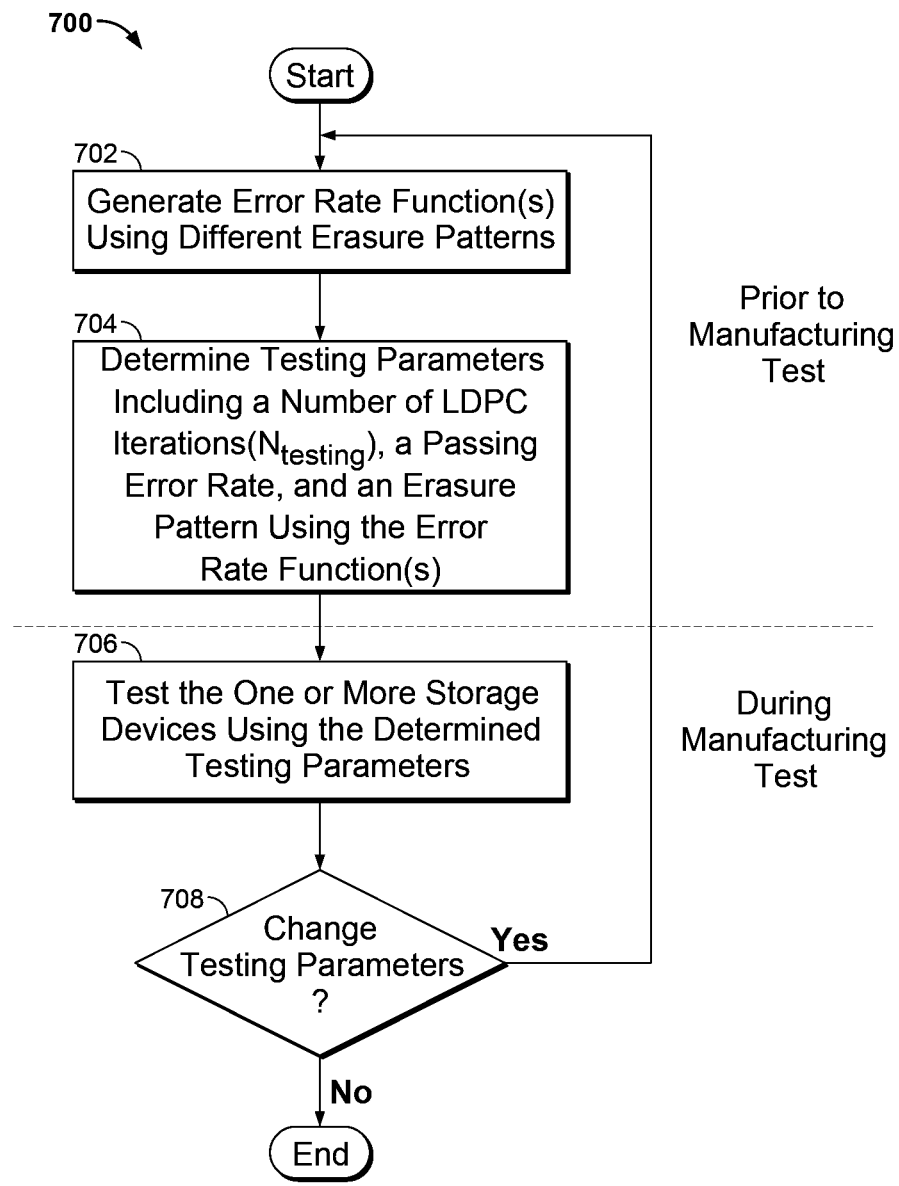
FIG. 7 is a flowchart illustrating an embodiment of a process 700 for developing a manufacturing test and testing one or more storage devices using the developed test.

FIG. 7 is a flowchart illustrating an embodiment of a process 700 for developing a manufacturing test and testing one or more storage devices using the developed test. In the example shown, the flowchart is divided into two portions: prior to a manufacturing test (steps 702-704) and during a manufacturing test (steps 706-708).

At 702, error rate function(s) using different erasure patterns are generated. For example, a plurality of storage devices may be used to generate each error rate function. For each storage device, known data is encoded using an LDPC code and written to the storage device. The data is then read back and decoded at different number of iterations. In some embodiments, the storage device is programmed by the manufacturing tester to apply a specific erasure pattern. For example, the storage device may include one or more input registers/pins/memories for specifying the erasure pattern. The decoded data is then compared with the known data to determine whether there is any error. The errors are recorded and then used to generate the error rate function.

At 704, a set of testing parameters, including $N_{testing}$, its corresponding passing error rate, and an erasure pattern is determined using the generated error rate functions. As described above, the set of testing parameters can be determined based on a number of factors, including the total amount of time that can be allocated for testing, the amount of test time allocated per storage device, and the number of sectors to be tested per storage device. Other factors include a target manufacturing yield, a target manufacturing failure parts per million (FPPM) value, and a target margin reserved for field-grown defects.

As shown in FIG. 5, many possible combinations of the number of LDPC iterations, the passing error rate, and the erasure pattern may be derived from the various error rate functions. Each of a subset of these combinations may be suitable as the testing parameters for testing the storage devices while giving a satisfactory yield, FPPM value, and margin for field-grown defects.

One way to determine whether a specific combination satisfies all the specified factors is described next. Suppose a total of x storage devices are to be produced and tested, a subset of the x storage devices, e.g., y, are allocated for determining whether the specific combination satisfies all the specified factors. Each of the y storage devices is programmed to apply the specified erasure pattern. After the specified number of LDPC iterations, the storage device's error rate is determined and whether the storage device passes or fails based on the specified passing error rate is determined. After the y storage devices are tested, the number of passed storage devices provides an estimate of the manufacturing yield. The passed storage devices can be tested by a long-term reliability test, which can last for days, weeks, or even months. The portion of the passed storage devices that fail the long-term reliability test can be used to estimate the manufacturing FPPM value. If the specific combination of number of LDPC iterations, passing error rate, and erasure pattern gives a satisfactory yield, FPPM value, and margin for field-grown defects, then the combination may be used as the testing parameters for testing the x storage devices in the next step (step 706).

In some embodiments, as soon as one satisfactory set of testing parameters is determined, the process may proceed to the next step (step 706). In some embodiments, more combinations of number of LDPC iterations, passing error rate, and erasure pattern may be tested using the long-term reliability test described above, and the best combination may be selected as the final set of testing parameters.

At 706, one or more storage devices are tested using the determined testing parameters, including $N_{testing}$, its corresponding passing error rate, and an erasure pattern. For example, each storage device under test is programmed to apply the specified erasure pattern. After $N_{testing}$ iterations, if the error rate of a storage device is higher than the passing error rate, then the storage device being tested is marked as having failed the manufacturing test.

At 708, a determination is made as to whether the testing parameters should be changed. If the testing parameters have been changed, then the process returns to 702 (or 704) again.

Referring back to FIG. 6, in some embodiments, one or multiple erasure windows may be applied during the manufacturing testing process to leave margin for field-grown defects. A storage device that has gone through manufacturing testing and passed such testing may nevertheless contain defects on one or more of its sectors, e.g., having a scratch on a sector. These defects can grow in size and depth over time. To reserve some margin for these field-grown defects or new defects in a sector of a storage device, when the sector is being tested for quality, one or multiple erasure windows may be applied to the LLR values going from channel detector 602 to LDPC decoder 604 and/or the feedback signal carrying the extrinsic information from LDPC decoder 604 to channel detector 602. In some embodiments, an erasure window is obtained by reducing the amplitude of a window of consecutive LLR/EXT values or zeroing out a window of consecutive LLR/EXT values. In some embodiments, the size of the erasure window may be programmable. For example, the storage device may include one or more input registers/pins/memories for specifying the length and location of the erasure window(s).

However, if the erasure window applied to a sector of a storage device during the manufacturing testing process happens to overlap with a real defect existing in that sector at that time, then erasing the LLR/EXT values actually causes the error rate during testing to appear to be lower than its real error rate without applying erasure. This will result in negative margining, and the storage device may pass the manufacturing testing process even though the sector with the defect will fail to be decoded properly in the field. In this case, one way to recover the sector is by applying the same erasure window that was used during manufacturing testing and decoding the defective sector again.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for testing storage devices, comprising:
    a processor; and
    a memory coupled with the processor, wherein the memory is configured to provide the processor with instructions which when executed cause the processor to:
        generate an error rate function, wherein the error rate function is a function of a number of LDPC iterations, and wherein the error rate function corresponds to an erasure pattern;
        determine a set of testing parameters at least in part based on the error rate function, wherein the set of testing parameters comprises a testing number of LDPC iterations, a passing error rate, and the erasure pattern; and
        test one or more storage devices using the set of testing parameters.

2. The system of claim 1, wherein generating the error rate function includes:
    writing known data to a testing storage device;
    reading the known data back from the testing storage device; and
    causing the testing storage device to erase at least one of an LLR signal and a feedback signal according to the erasure pattern, wherein the LLR signal is received by a low-density parity-check (LDPC) decoder from a channel detector of the testing storage device, and wherein the feedback signal is received by the channel detector from the LDPC decoder.

3. The system of claim 2, wherein generating the error rate function further includes:
    comparing the data read back from the testing storage device with the known data.

4. The system of claim 2, wherein erasing includes reducing the amplitude or zeroing out the at least one of the LLR signal and the feedback signal.

5. The system of claim 2, wherein erasing comprises erasing in an evenly distributed erasure pattern.

6. The system of claim 2, wherein erasing comprises erasing a window of the at least one of the LLR signal and the feedback signal.

7. The system of claim 1, wherein determining the set of testing parameters is at least in part based on one or more of the following:
    an estimate of a manufacturing yield;
    an estimate of a failure parts per million value; and
    an error rate margin.

8. A method for testing storage devices, comprising:
    generating an error rate function by a processor, wherein the error rate function is a function of a number of LDPC iterations, and wherein the error rate function corresponds to an erasure pattern;
    determining by the processor a set of testing parameters at least in part based on the error rate function, wherein the set of testing parameters comprises a testing number of LDPC iterations, a passing error rate, and the erasure pattern; and
    testing one or more storage devices using the set of testing parameters.

9. The method of claim 8, wherein generating the error rate function includes:
    writing known data to a testing storage device;
    reading the known data back from the testing storage device; and
    causing the testing storage device to erase at least one of an LLR signal and a feedback signal according to the erasure pattern, wherein the LLR signal is received by a low-density parity-check (LDPC) decoder from a channel detector of the testing storage device, and wherein the feedback signal is received by the channel detector from the LDPC decoder.

10. The method of claim 9, wherein generating the error rate function further includes:
    comparing the data read back from the testing storage device with the known data.

11. The method of claim 9, wherein erasing includes reducing the amplitude or zeroing out the at least one of the LLR signal and the feedback signal.

12. The method of claim 9, wherein erasing comprises erasing in an evenly distributed erasure pattern.

13. The method of claim 9, wherein erasing comprises erasing a window of the at least one of the LLR signal and the feedback signal.

14. The method of claim 8, wherein determining the set of testing parameters is at least in part based on one or more of the following:
    an estimate of a manufacturing yield;
    an estimate of a failure parts per million value; and
    an error rate margin.

15. A computer program product for testing a storage system, the computer program product being embodied in a non-transitory computer readable storage medium and comprising computer instructions for:
    generating an error rate function, wherein the error rate function is a function of a number of LDPC iterations, and wherein the error rate function corresponds to an erasure pattern;

determining a set of testing parameters at least in part based on the error rate function, wherein the set of testing parameters comprises a testing number of LDPC iterations, a passing error rate, and the erasure pattern; and testing one or more storage devices using the set of testing parameters.

* * * * *